(12) United States Patent  
Gorman

(10) Patent No.: US 6,621,440 B2
(45) Date of Patent: Sep. 16, 2003

(54) DIGITAL TO ANALOGUE CONVERTER

(75) Inventor: Christopher M. Gorman, Tuam (IE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/114,507

(22) Filed: Apr. 2, 2002

(65) Prior Publication Data

US 2002/0145552 A1 Oct. 10, 2002

(30) Foreign Application Priority Data

Apr. 6, 2001 (GB) .............................. 0108656

(51) Int. Cl.[7] .......................... H03M 1/78; H03M 1/66
(52) U.S. Cl. ....................................... 341/154; 341/144
(58) Field of Search .............................. 341/144, 155, 341/145, 153, 154

(56) References Cited

U.S. PATENT DOCUMENTS

| 4,459,580 A | * | 7/1984 | Furukawa | 341/144 |
|---|---|---|---|---|
| 4,918,448 A | * | 4/1990 | Hauviller et al. | 341/145 |
| 5,093,661 A | * | 3/1992 | Tanimoto | 341/144 |
| 5,495,245 A | | 2/1996 | Ashe | 341/144 |
| 5,534,862 A | * | 7/1996 | Gross et al. | 341/144 |
| 5,554,986 A | | 9/1996 | Neidorff | 341/145 |
| 5,617,091 A | * | 4/1997 | Uda | 341/154 |
| 5,627,537 A | | 5/1997 | Quinlan et al. | 341/144 |
| 5,648,780 A | * | 7/1997 | Neidorff | 341/154 |
| 5,703,588 A | | 12/1997 | Rivoir et al. | 341/159 |
| 5,714,953 A | * | 2/1998 | Mitani et al. | 341/144 |
| 5,831,566 A | | 11/1998 | Ginetti | 341/144 |
| 5,838,273 A | | 11/1998 | Sauerbrey et al. | 341/145 |
| 5,969,657 A | | 10/1999 | Dempsey et al. | 341/145 |
| 5,969,658 A | * | 10/1999 | Naylor | 341/154 |
| 5,977,898 A | * | 11/1999 | Ling et al. | 341/144 |
| 5,999,115 A | * | 12/1999 | Connell et al. | 341/145 |

FOREIGN PATENT DOCUMENTS

JP    10004354 A    1/1998    ............ H03M/1/74

* cited by examiner

Primary Examiner—Jean Bruner JeanGlaude
(74) Attorney, Agent, or Firm—Steven R. Biren

(57) ABSTRACT

A digital to analogue converter comprising at least two resistor ladders (A, B) and at least two banks of switches (SwA, SwB etc.), means for controlling said switches in accordance with at least the MSBs of a digital input signal, connecting means (Rx) for connecting the two resistor ladders at their ends to form a ring topology, said connecting means comprising means for deriving two analogue output signals to form a differential analogue output signal. The output means may include further resistance ladders and switch banks (C, D) to provide higher resolution in segmented fashion. The first and second banks of switches are on the supply side of the ladders, to avoid loading effects. Optionally each switch forms one of a matched pair of switches controlled to be closed and opened as a pair, the second switch in operation providing feedback to an amplifier (AMPA, AMPB) such that a reference voltage can be imposed on the ladder independently of the resistance of the switches.

12 Claims, 5 Drawing Sheets

DIGITAL TO ANALOGUE CONVERTER

BACKGROUND OF THE INVENTION

The present invention relates to digital to analogue converters (DACs) and more specifically to resistor ladder digital to analogue converters.

It is known in the art to use DACs for a wide variety of applications where a digital word needs to be converted to an analogue signal. The need for these devices is increasing greatly as we enter an increasingly digital age, where our music, television, movies and communications are digitally coded.

The basic resistor ladder form of DAC is shown in FIG. 1. There are P−1 resistors connected in series between reference voltage sources Vref+ and Vref−. This divides the voltage into steps of (Vref+−Vref−)/P−1. There are P tap-off points inclusive of Vref+ and Vref−. Each of these tap-off points is connected to the analogue output Vout via a respective switch. The input digital word is decoded and used to close one of the switches. Hence the required output voltage is generated. The output voltage is buffered with a high impedance output stage 2, so that the resistance of the switch causes no voltage drop.

This design is very wasteful as P becomes very large, in that a vast number of resistors and switches may be needed (a 20-bit DAC would need over 1 million resistors and switches). As is well known in the art, providing that P can be factorised to P=MN, it is possible to implement the same function using a lot fewer resistors and switches than the circuit in FIG. 1, by segmenting the resistor array into a number of stages.

For example, U.S. Pat. No. 5,495,245 describes a DAC wherein the resistor ladder has been segmented into two separate outer ladders and an inner ladder. Each outer ladder divides a full scale voltage and selects a tap in accordance with the most significant bits (MSBs) of the digital input word. Opposite ends of the inner ladder are connected to the selected tap points on the outer ladders, so that a voltage interval spanned by the inner ladder effectively slides up and down as the MSBs of the input signal vary. Switches on the inner ladder respond to the least significant bits (LSBs), to select the final output voltage, within the interval defined by the MSBs.

Other segmented DAC designs are known from U.S. Pat. Nos. 5,554,986 and 5,703,588. Various sources of error are known in such devices, arising from imperfect matching of resistor values, switch resistances, loading effects and so forth.

Loading of the outer resistor ladders by the second ladder in U.S. Pat. No. 5,495,245 is eliminated by allowing all the current in the two outer ladders to pass through the inner ladder. To work satisfactorily, this requires the inner ladder resistors to be scaled such that the total resistance of the inner ladder is equal to the resistance of a single resistor in the outer ladder. This has the disadvantage of a possible mismatch of resistor values, since matching is only readily achieved between resistors of identical value, or simple ratios. If the resistance is not exactly matched then an error occurs every time the inner ladder is moved.

Furthermore, in known designs some or all of the current flowing between Vref+ and Vref− must be diverted via the MSB switches to operate the inner ladder. Each switch has a non-zero resistance, which may vary from switch to switch in the same ladder and being in series between the outer and inner ladder. This leads to distortion in the matching between the inner ladder resistance and the resistance at each step if the outer ladder. Large switches will be required to keep this error down, which in effect will take up a lot of the area saved by segmenting in the first place.

SUMMARY OF THE INVENTION

The inventor has sought to provide an improved segmented ladder DAC design, which eliminates one or both these drawbacks. Independently, the inventor also seeks to provide DAC designs providing differential rather than single-ended outputs, without necessarily doubling the size of the circuit.

The invention in a first aspect provides a digital to analogue converter comprising at least first and second resistor ladders and at least first and second banks of switches, means for controlling said switches in accordance with at least the most significant bits of a digital input signal, first and second connecting means for connecting said first and second resistor ladders at their ends to form a ring topology, said first and second connecting means comprising means for deriving respective first and second analogue output signals to form a differential analogue output signal.

The invention in a second aspect of the invention provides a digital to analogue converter of segmented type, comprising at least first, second and third resistor ladders and at least first, second and third banks of switches, where the first two resistor ladders are connected in series by a load resistor and the third resistor ladder is connected across said load resistor, wherein a reference voltage source is connectable to selected points on each of the first and second resistor ladders via corresponding switches in the first and second banks of switches, said switches being selected in operation in accordance with the most significant bits of a digital input signal, and wherein an output is connectable to a selected point on the third resistor ladder via a corresponding switch in the third bank of switches, said switch being selected in operation in accordance with the least significant bits of said digital input signal.

The invention in a third aspect of the invention provides a digital to analogue converter comprising at least first and second resistor ladders and at least first and second banks of switches, means for controlling said switches in accordance with at least the most significant bits of a digital input signal, wherein each switch of the first and second banks of switches forms one of a matched pair of switches controlled to be closed and opened as a pair, the second switch in operation providing feedback to an amplifier such that a reference voltage can be imposed on the ladder independently of the resistance of the switches.

These and other optional features of the invention are defined in the appended claims. The three aspects of the invention may be applied independently of one another. The three aspects of the invention may also be used in any combination, as illustrated in the detailed description of the embodiments which follows.

BRIEF DESCRIPTION OF THE DRAWINGS

A conventional resistor ladder DAC and embodiments of the invention will now be described, by way of example only, with reference to the accompanying drawings, in which.

DESCRIPTION OF THE PREFERRED EMBODIMENTS

Figure 2:
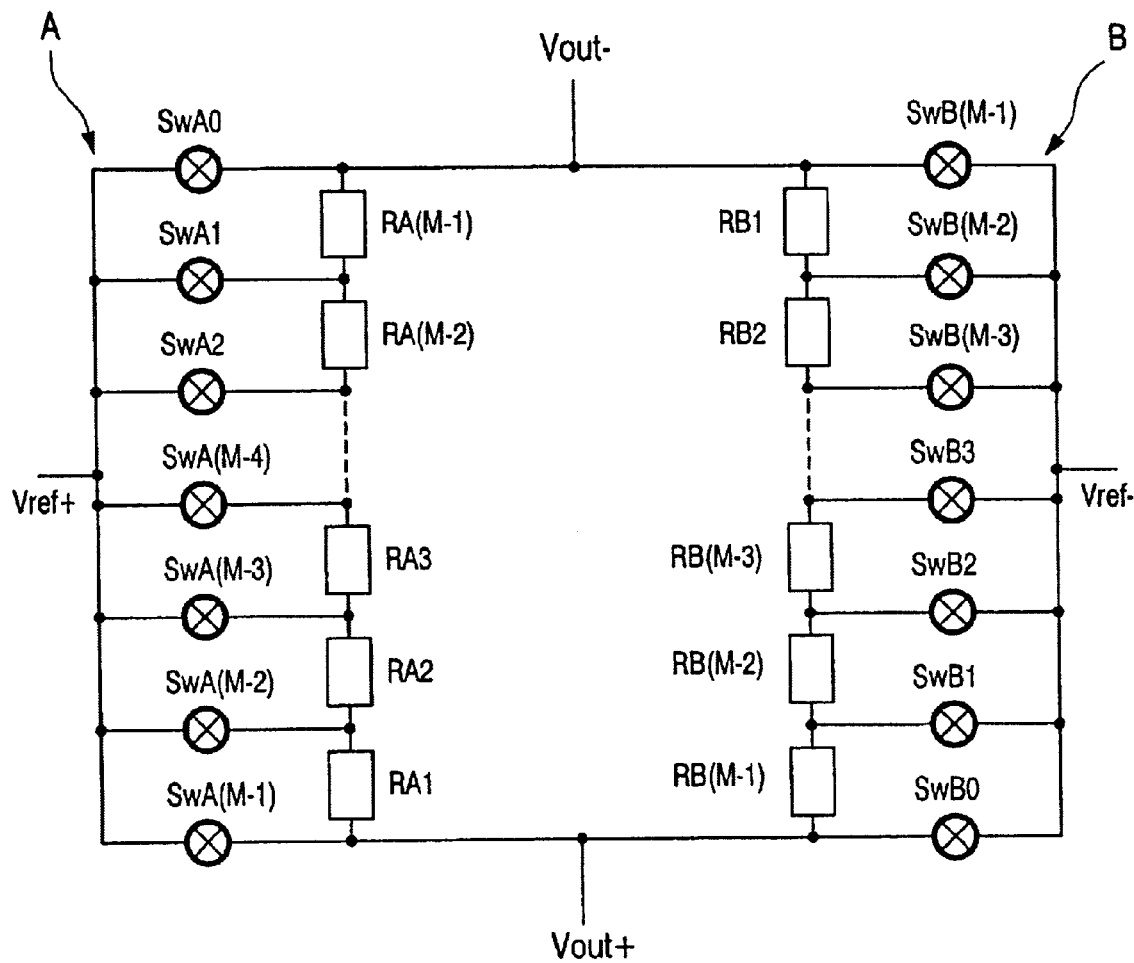
FIG. 2 represents a novel differential resistor ladder DAC having a ring configuration.

FIG. 2 shows a differential ring-form DAC in basic form. There is a single stage DAC comprising two MSB resistor ladders (ladder A and ladder B). The resistors in ladder A will be referred to as RA1, RA2, RA3 . . . RA(M−1), where M−1 resistors make up this resistor ladder. Similarly the resistors in ladder B will be referred to as RB1, RB2, RB3 . . . RB(M−1).

Resistor ladder A is connected to source of a reference voltage Vref+via an array of M switches (SwA0, SwA1 . . . SwA(M−1)), each switch connecting a different point on the ladder to the reference voltage Vref+, with switches SwA0 and SwA(M−1) connected at each the top and bottom of the ladder respectively. All resistors RA, RB and Rx have a standard value R. Ladder B is similarly connected to the Vref− terminal by a further array of M switches (SwB0, SwB1 . . . SwB(M−1)).

These two resistor ladders are connected to each other, top to bottom and bottom to top to form a novel ring structure (i.e. RA(M−1) to RB1 and RA1 to RB(M−1)). An output is taken from each of the points where these ladders are connected. This therefore provides for a differential output.

Being only a single stage converter, this embodiment is particularly useful when very low power supplies are required. It has the further advantage in that there are no output switches and therefore no problem of non linearity in T-gates with low power rails.

Figure 3:
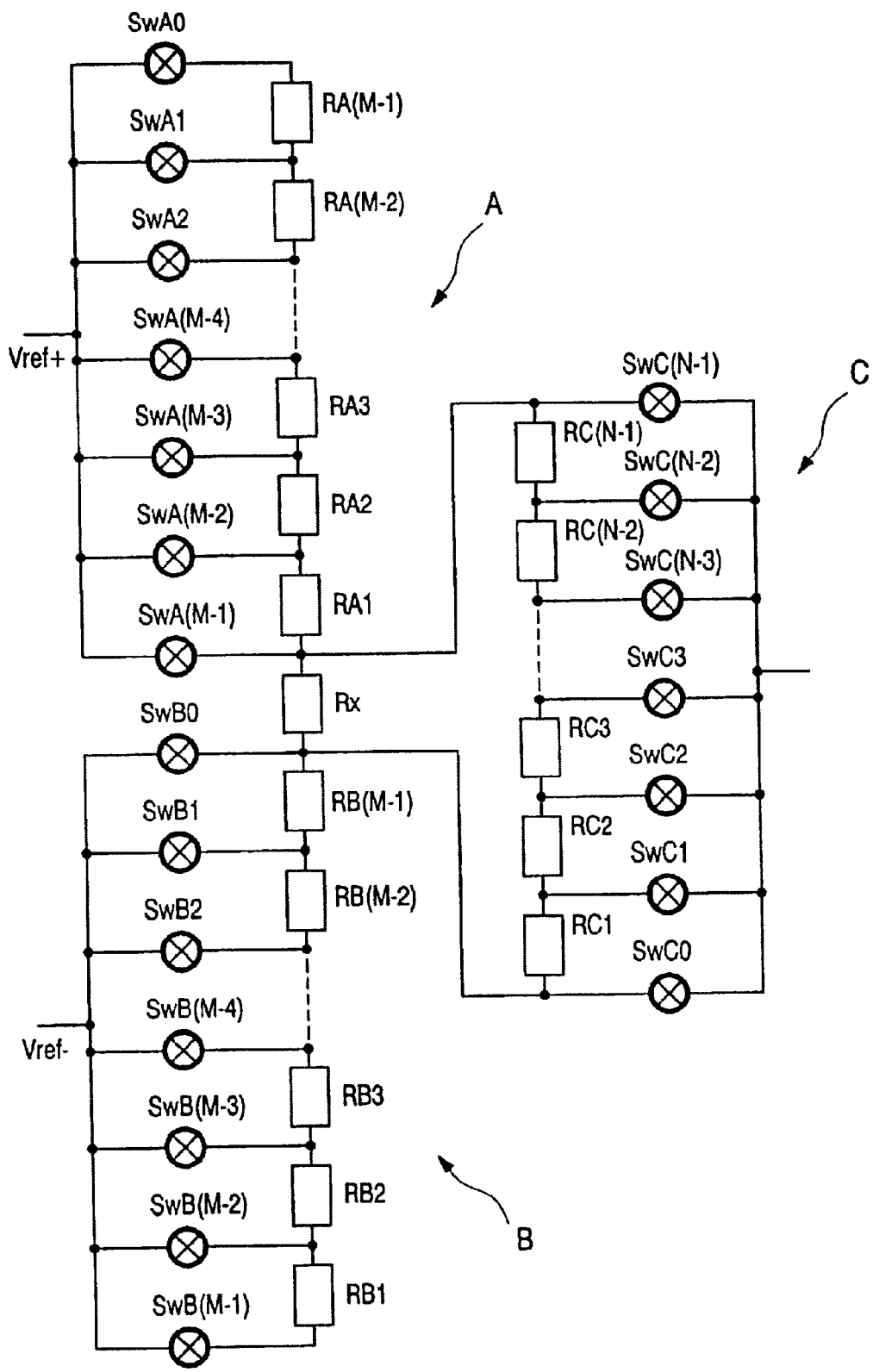
FIG. 3 illustrates a novel segmented ladder DAC, having reduced susceptibility to switch resistance and resistor mismatch.

A segmented DAC is shown in FIG. 3. This DAC comprises three resistor ladders. The first two of these ladders (ladder A and ladder B) are the most significant bit (MSB) or "coarse" ladders, and the third (ladder C) is the least significant bit (LSB) or "fine" ladder. MSB ladders A and B are connected together by a further resistor Rx, in series with both resistor ladders.

Resistor ladder A is connected to source of a reference voltage Vref+ via an array of M switches (SwA0, SwA1 . . . SwA(M−1)), each switch connecting a different point on the ladder to the reference voltage Vref+, with switches SwA0 and SwA(M−1) connected at each the top and bottom of the ladder respectively. Ladder B is similarly connected to the Vref− terminal by a further array of M switches (SwB0, SwB1 . . . SwB(M−1)).

The third resistor ladder (ladder C) is made up of N−1 resistors (RC1, RC2, . . . RC(N−1). connected in series. This second ladder is connected in parallel to the resistor Rx situated between ladder A and ladder B.

All resistors RA, RB, RC and Rx have a standard value R.

The output of the DAC, Vout, is taken from this third ladder via a further array of N switches SwC0, SwC1 . . . SwC(N−1), one connected at every point on this ladder between each of the resistors with one switch connected at each the top (SwC(N−1)) and bottom (SwC0) of the ladder to RA1 and to RB(M−1) respectively.

The position in which Vref+ and Vref− are connected into the MSB ladder is controlled by the switches SwA and SwB in the MSB resistor ladders. These switches are set in accordance with the MSBs of the digital word by a decoder (not shown). Only one switch is closed in each ladder at any one time. Further, which ever switch is closed in ladder A, the corresponding switch is closed in ladder B. For example, if switch SwA2 is closed then so will be SwB2, and no others in either MSB ladder. This ensures there is always a series of M resistors connected between Vref+ and Vref−.

The two MSB ladders (A and B) can therefore effectively be looked upon as one ladder with M resistors connected between Vref+ and Vref− wherein the Rx resistor (and therefore ladder C connected across Rx) changes position in relation to the other M resistors in this ladder depending on the MSBs at the output of the decoder. Since there are M positions where Rx can be located and N tap off points per position, then there are a total of MN tap off points. Therefore if MN is made to equal P, there is the same number of tap off points as with the basic resistor DAC of FIG. 1 but using far fewer resistors and switches.

The normal use of this circuit is when converting a binary digital word into an analogue voltage with a resolution of P steps. In this case $P=2^Z$. This can be factorised in such a way that $2^Z=2^X 2^Y$. Therefore $M=2^X$ and $N=2^Y$. The X most significant bits are decoded to select switches in ladders A and B, while the Y least significant bits are decoded and used to select the switch in ladder C.

Figure 1:
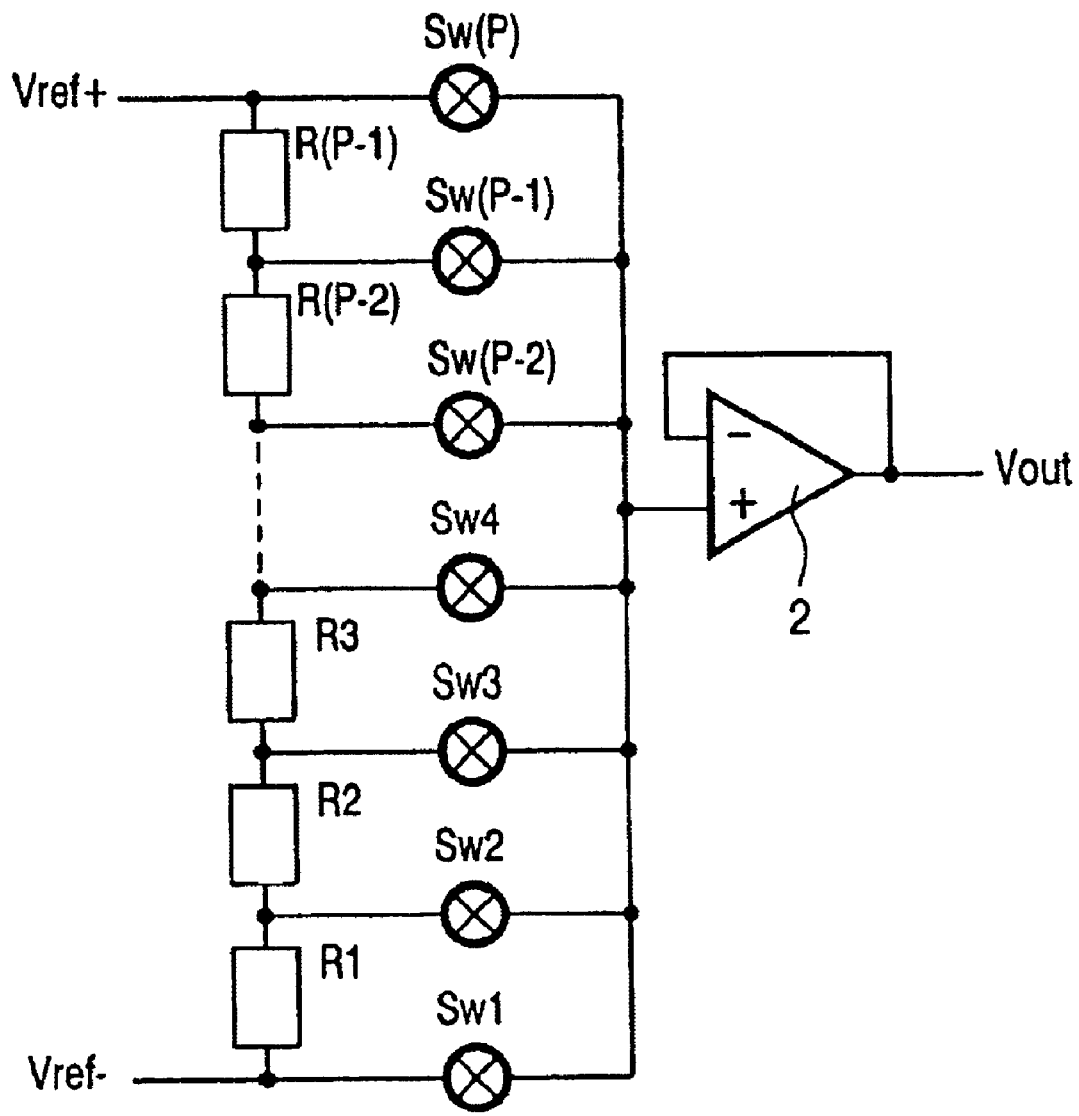
FIG. 1 illustrates a conventional resistor ladder DAC.

Looking at the voltages at the various points, as with the basic resistor DAC in FIG. 1, one would expect the design to be such that the LSB step in Vout=would be (Vref+−Vref−)/P−1. This can indeed be shown to be the case. The resistor Rx has a resistor ladder in parallel to it of resistance (N−1)R. Hence the resistance between the end of this resistor is:

$$Rt=Rx//(N-1)R=R(N-1)/N=Rt.$$

There are M resistors including this resistor between Vref+ and Vref−. The ladder resistance is therefore:

$$(M-1)R+R(N-1)/N=(M-1/N)R=((MN-1)/N)R$$

This resistance must be broken into (MN−1) (i.e. (P−1)) steps. Hence the resistance in each step should be (1/N)R.

As Rt=((N−1)/N)R and this broken into N−1 parts, each step equals (1/N)R. Furthermore the difference between Rt and a standard R is also (1/N)R. Hence when the switches move the position of Rx up by one, it results in a step of (1/N)R between the bottom of the new position and the top of the old one.

A key distinction between this DAC and conventional designs is that the switches are positioned the opposite side of the resistor ladders to Rx (i.e. on the supply side). This means that, in calculating the equivalent resistance of Rx parallel to ladder C as described above, the inherent resistance of the switches did not need to be taken into account, and a source of non-linearly has been eliminated. An on-resistance will have the effect of reducing the range of values slightly, which was the case in the known designs. Compared with U.S. Pat. No. 5,495,245 identified in the introduction, another advantage is that all resistors have the same value R, such that matching will be easier.

Figure 4:
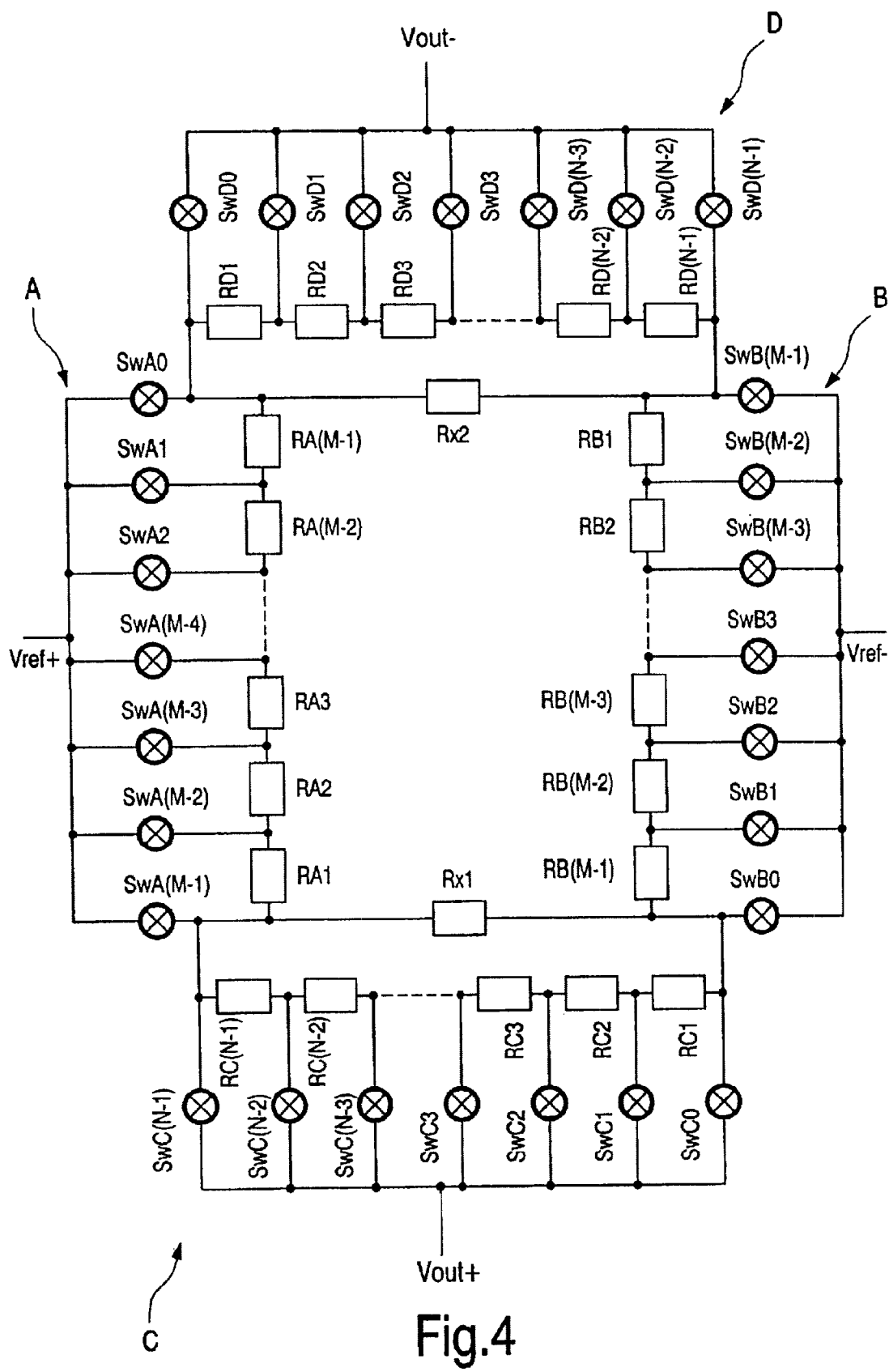
FIG. 4 illustrates a differential segmented resistor ladder DAC combining features of FIGS. 2 and 3.

FIG. 4 shows a circuit combining the two ideas above thus providing for a segmented DAC with a differential output. Differential output is desirable so as to eliminate the problem of noise on the ground node appearing on the output, leading to a poor power supply rejection ratio.

As before, there are two MSB ladders, A and B, with a first Rx resistor, Rx1 connected between resistors RA1 and RB(M−1) and a third resistor ladder (ladder C) across it. This resistor ladder is connected by an array of switches to an output Vout+.

In this embodiment, however there is a second Rx resistor, Rx2, which is connected between resistors RA(M−1) and RB1 (i.e the top of ladder A and the bottom of ladder B as depicted in FIG. 3). This resistor has a second LSB resistor ladder (ladder D) connected across it comprising RD1–RD (N−1). This second ladder is connected in the same way as ladder C via switches to a complementary output Vout.−.

Therefore, a ring of resistors made up of Ladder A, Ladder B, Rx1 and Rx2 is formed. When the reference voltages are connected to this ring there are provided two complete segmented DACs in parallel between Vref+ and Vref−, one of which is around Rx1 and the other around Rx2. Rx1 and Rx2 in these DACs are positioned opposite each other. This allows two opposite outputs to be taken, Vout+ and Vout− (one from each of the DACs). The difference between the outputs Vout+ and Vout− represents a differential output corresponding to the digital input. While the LSB ladders have been duplicated, the MSB ladders are shared between the two halves of the differential circuit, achieving a substantial saving in the number of switches and resistors required.

It should be noted that an advantage of keeping a 1:1 ratio between the resistors in the first and second ladders means the loading effect is exactly one LSB. As before, switch resistance is in series with the supply, not the LSB ladder alone, and good linearity is maintained.

Figure 5:
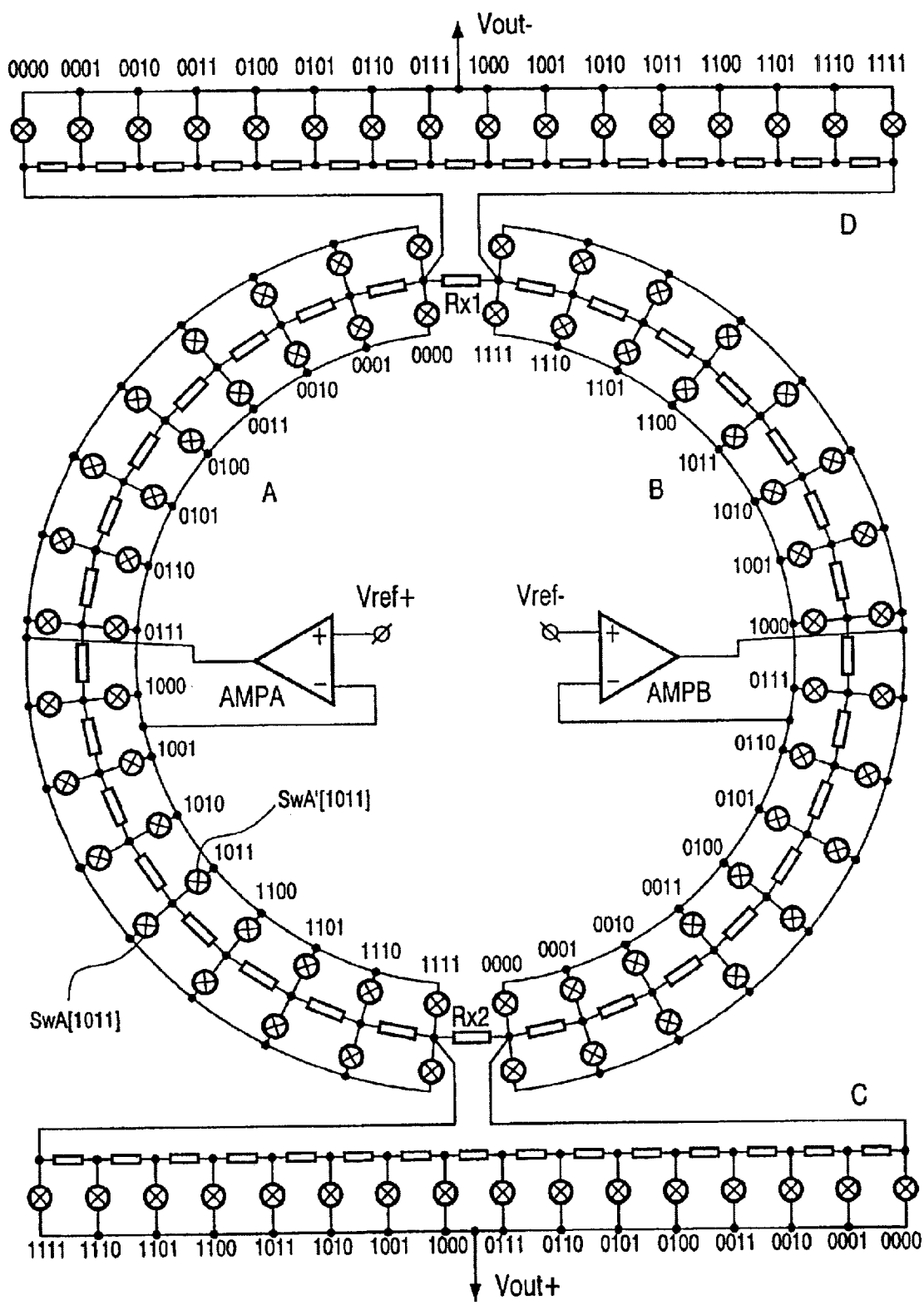
FIG. 5 illustrates a further differential segmented resistor ladder DAC with features for the elimination of switch-resistance error.

An improvement of the differential output version of the DAC according to the invention is depicted in FIG. 5. This depicts an 8-bit implementation of this DAC with M=N−16. This uses the same basic layout as the differential DAC of FIG. 4 with MSB resistor ladders A and B joined by two resistors Rx1 and Rx2, both of which each have a further LSB resistor ladder (C and D) across them. From these LSB ladders, via switches, as before, a differential output is generated.

Instead of if a single switch SwA0, SwB0 etc being included at each point in the MSB ladders A and B, however, a pair of switches is now included at each position. In the diagram each position is labelled 0000 to 1111, the label corresponding to the MSB value 0000 to 1111, in response to which of that particular pair of switches will be closed. One pair of switches is labelled by way of example SwA [1011] and SwA' [1011]. For each ladder A and B, there is now provided an operational amplifier AMPA and AMPB, and the reference voltage Vref+ and Vref− is applied to the non-inverting input of the appropriate amplifier. The output of the amplifier in each ladder supplies the outer ring of switches SwA, while the inner ring SwA' etc provides a sensing signal to the inverting input of the respecting amplifier. In this way, a "force-and-sense" arrangement is achieved which drives the desired point on the resistor ladder exactly to the reference voltage therefore eliminating all offset due to the resistance of the switches. Note that the feedback SwA' switch can be of minimum size as it conducts no current due to the high impedance of the buffer input.

In operation therefore, four most significant bits select which switches in ladders A and B that are turned on. Each code effectively represents an axis of the ring along which four switches are located. For a particular MSB code all the switches on that axis are closed while all other switches are opened. The four closed switches then provide a force-and-sense path for each reference voltage. The two points at which the selected axis intersect the resistor ring are charged by the reference buffers to Vref+ and Vref− respectively. The four LSBs are converted as in the previous example. Note in this specific case there are 15 resistors in parallel with each Rx providing 16 tap off points. There is also the same number of resistors in ladders A and B. Therefore there is a total of 256 or 28 tap off points.

The symbols used in the Figures to represent the switches of the converters denote T-gate switches, which are preferred owing to their versatility. It will be readily appreciated by those skilled in the art that other types of switches may be employed. For example, in the illustrated embodiments, the switches of ladders A and B may instead be PMOS and NMOS devices, respectively, providing that Vref+ is close to the positive rail voltage of the DAC, and Vref− is close to the negative rail voltage.

From reading the present disclosure, other variations and modifications will be apparent to persons skilled in the art. Such variations and modifications may involve equivalent and other features which are already known in the design, manufacture and use of digital to analogue converters, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present Application or of any further Application derived therefrom.

What is claimed is:

1. A digital to analogue converter comprising at least first and second resistor ladders and at least first and second banks of switches, means for controlling said switches in accordance with at least the most significant bits of a digital input signal, first and second connecting means for connecting said first and second resistor ladders at their ends to form a ring topology, said first and second connecting means comprising means for deriving respective first and second analogue output signals to form a differential analogue output signal.

2. A digital to analogue converter as claimed in claim 1 wherein complementary reference voltage sources are connectable to individual points on each of the first two resistor ladders via corresponding switches in the first two banks of switches, said control means selecting the switches in operation so as to divide the ring into two equal halves.

3. A digital to analogue converter as claimed in claim 1 wherein said first and second connecting means comprise first and second load resistances in parallel respectively with third and fourth load resistor ladders said third and fourth resistor ladders each having connected to them a respective bank of switches forming the respective output means, said third and fourth banks of switches being controlled in response to less significant bits of said digital input signal thereby providing a converter of segmented type with differential output.

4. A digital to analogue converter as claimed in claim 3 wherein each output signal is derived from a point on each of said third and fourth resistor ladders via a corresponding switch in its respective bank of switches.

5. A digital to analogue converter as claimed in claim 1 wherein each switch of the first and second banks of switches forms one of a matched pair of switches controlled to be closed and opened as a pair, the second switch in switches controlled to be closed and opened as a pair, the second switch in operation providing feedback to an amplifier such that a reference voltage can be imposed on the ladder independently of the switches.

6. A digital to analogue converter of segmented type, comprising at least first, second and third resistor ladders and at least first, second and third banks of switches, where the first two resistor ladders are connected in series by a load resistor and the third resistor ladder is connected across said load resistor, wherein a reference voltage source is connectable to selected points on each of the first and second resistor ladders via corresponding switches in the first and second banks of switches, said switches being selected in operation in accordance with the most significant bits of a digital input signal, and wherein an output is connectable to a selected point on the third resistor ladder via a corresponding switch in the third bank of switches, said switch being selected in operation in accordance with the least significant bits of said digital input signal.

7. A digital to analogue converter as claimed in claim 6 further comprising a decoder circuit arranged to receive said digital input signal and to control the operation of the first, second and third switch banks in accordance with the value of said signal.

8. A digital to analogue converter as claimed in claim 6 wherein each switch of the first and second banks of switches forms one of a matched pair of switches controlled to be closed and opened as a pair, the second switch in operation providing feedback to an amplifier such that a reference voltage can be imposed on the ladder independently of the resistance of the switches.

9. A digital to analogue converter comprising at least first and second resistor ladders and at least first and second banks of switches, means for controlling said switches in accordance with at least the most significant bits of a digital input signal, wherein each switch of the first and second banks of switches forms one of a matched pair of switches controlled to be closed and opened as a pair, the second switch in operation providing feedback to an amplifier such that a reference voltage can be imposed on the ladder independently of the resistance of the switches.

10. A digital to analogue converter comprising at least first and second resistor ladders and at least first and second banks of switches, means for controlling said switches in accordance with at least the most significant bits of a digital input signal, said first and second resistor ladders being connected at their ends to form a ring topology, and wherein an output is taken at each of the points where the ladders are connected thus providing for a differential output.

11. A digital to analogue converter as claimed in claim 10 wherein complementary reference voltage sources are connectable to individual points on each of the first two resistor ladders via corresponding switches in the first two banks of switches, said control means selecting the switches in operation so as to divide the ring into two equal halves.

12. A digital to analogue converter as claimed in claim 10 herein said first and second resistor ladders are connected at their ends via load resistances and there are provided at least third and fourth resistor ladders each connected in parallel with a respective one of said load resistances, said third and fourth resistor ladders each having connected to them a respective bank of switches controlled in response to less significant bits of said digital input signal thereby providing a converter of segmented type with differential output.

* * * * *